United States Patent
Melik-Martirosian

(10) Patent No.: US 8,076,715 B2
(45) Date of Patent: Dec. 13, 2011

(54) DUAL-BIT MEMORY DEVICE HAVING ISOLATION MATERIAL DISPOSED UNDERNEATH A BIT LINE SHARED BY ADJACENT DUAL-BIT MEMORY CELLS

(75) Inventor: Ashot Melik-Martirosian, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 37 days.

(21) Appl. No.: 11/616,718

(22) Filed: Dec. 27, 2006

(65) Prior Publication Data

US 2008/0157263 A1    Jul. 3, 2008

(51) Int. Cl.
*H01L 29/792* (2006.01)

(52) U.S. Cl. .............. 257/324; 257/314; 257/E27.103

(58) Field of Classification Search .............. 257/315, 257/302, 395–397, 514–515, 510, E27.103, 257/324; 365/200; 438/241, 221, 296, 297
See application file for complete search history.

(56) References Cited

U.S. PATENT DOCUMENTS

| | | | | |
|---|---|---|---|---|
| 6,163,057 A * | 12/2000 | Okamura | | 257/386 |
| 6,177,698 B1 * | 1/2001 | Gruening et al. | | 257/302 |
| 6,261,902 B1 * | 7/2001 | Park et al. | | 438/257 |
| 6,294,817 B1 * | 9/2001 | Srinivasan et al. | | 257/397 |
| 6,365,451 B2 * | 4/2002 | Havemann | | 438/230 |
| 6,410,952 B2 * | 6/2002 | Momose et al. | | 257/288 |
| 2001/0040831 A1 * | 11/2001 | Gonzalez et al. | | 365/200 |
| 2002/0119618 A1 * | 8/2002 | Tseng et al. | | 438/241 |
| 2005/0274951 A1 * | 12/2005 | Howard | | 257/66 |
| 2006/0211188 A1 * | 9/2006 | Lusky et al. | | 438/201 |

* cited by examiner

*Primary Examiner* — Kiesha Bryant
*Assistant Examiner* — Tucker Wright

(57) ABSTRACT

A dual-bit memory device is provided which includes trench isolation material disposed below a bit line that is shared by adjacent memory cells. The dual-bit memory device comprises a substrate, a first memory cell designed to store two bits of information, a second memory cell designed to store two bits of information, and an insulator region. The first memory cell is adjacent to the second memory cell. The first memory cell includes a first buried bit line and a second buried bit line. The first memory cell and the second memory cell share the second buried bit line. The insulator region is disposed in the substrate below the second buried bit line to prevent electrons from flowing between the first memory cell and the second memory cell.

22 Claims, 8 Drawing Sheets

DUAL-BIT MEMORY DEVICE HAVING ISOLATION MATERIAL DISPOSED UNDERNEATH A BIT LINE SHARED BY ADJACENT DUAL-BIT MEMORY CELLS

FIELD OF THE INVENTION

The present invention generally relates to memory devices, and more particularly relates to dual-bit memory devices.

BACKGROUND OF THE INVENTION

Flash memory is a type of electronic memory media that can hold its data in the absence of operating power. Flash memory can be programmed, erased, and reprogrammed during its useful life (which may be up to one million write cycles for typical flash memory devices). Flash memory is becoming increasingly popular as a reliable, compact, and inexpensive nonvolatile memory in a number of consumer, commercial, and other applications. As electronic devices get smaller and smaller, it becomes desirable to increase the amount of data that can be stored per unit area on an integrated circuit memory cell, such as a flash memory unit.

One conventional flash memory technology is based upon a memory cell that utilizes a charge trapping dielectric cell that is capable of storing two bits of data. One example of this type of non-volatile memory device is known as a dual-bit Flash electrically erasable and programmable read-only memory (EEPROM), which is available under the trademark MIRRORBIT™ from Spansion, Inc., Sunnyvale, Calif. Such dual-bit memory cells utilize a single silicon nitride layer having two separate charge storage regions to store charge within the silicon nitride layer. In such an arrangement, one bit can be stored using a first charge storing region on one side of the silicon nitride layer, while a second bit can be stored using a second charge storing region on the other side of the same silicon nitride layer. For example, a left bit and right bit can be stored in physically different areas of the silicon nitride layer, near left and right regions of each memory cell, respectively. In comparison to a conventional EEPROM cell, a dual-bit memory cell can store twice as much information in a memory array of equal size.

SUMMARY

A dual-bit memory device is provided which includes trench isolation material disposed below a bit line that is shared by adjacent memory cells. The dual-bit memory device comprises a substrate, a first memory cell designed to store two bits of information, a second memory cell designed to store two bits of information, and an insulator region. The first memory cell is adjacent to the second memory cell. The first memory cell includes a first buried bit line and a second buried bit line. The first memory cell and the second memory cell share the second buried bit line. The insulator region is disposed in the substrate below the second buried bit line to prevent electrons from flowing between the first memory cell and the second memory cell.

BRIEF DESCRIPTION OF THE DRAWINGS

The present invention will hereinafter be described in conjunction with the following drawing figures, in which.

DETAILED DESCRIPTION AN EXEMPLARY EMBODIMENT

The following detailed description of the invention is merely exemplary in nature and is not intended to limit the invention or the application and uses of the invention. Furthermore, there is no intention to be bound by any theory presented in the preceding background of the invention.

Figure 1:
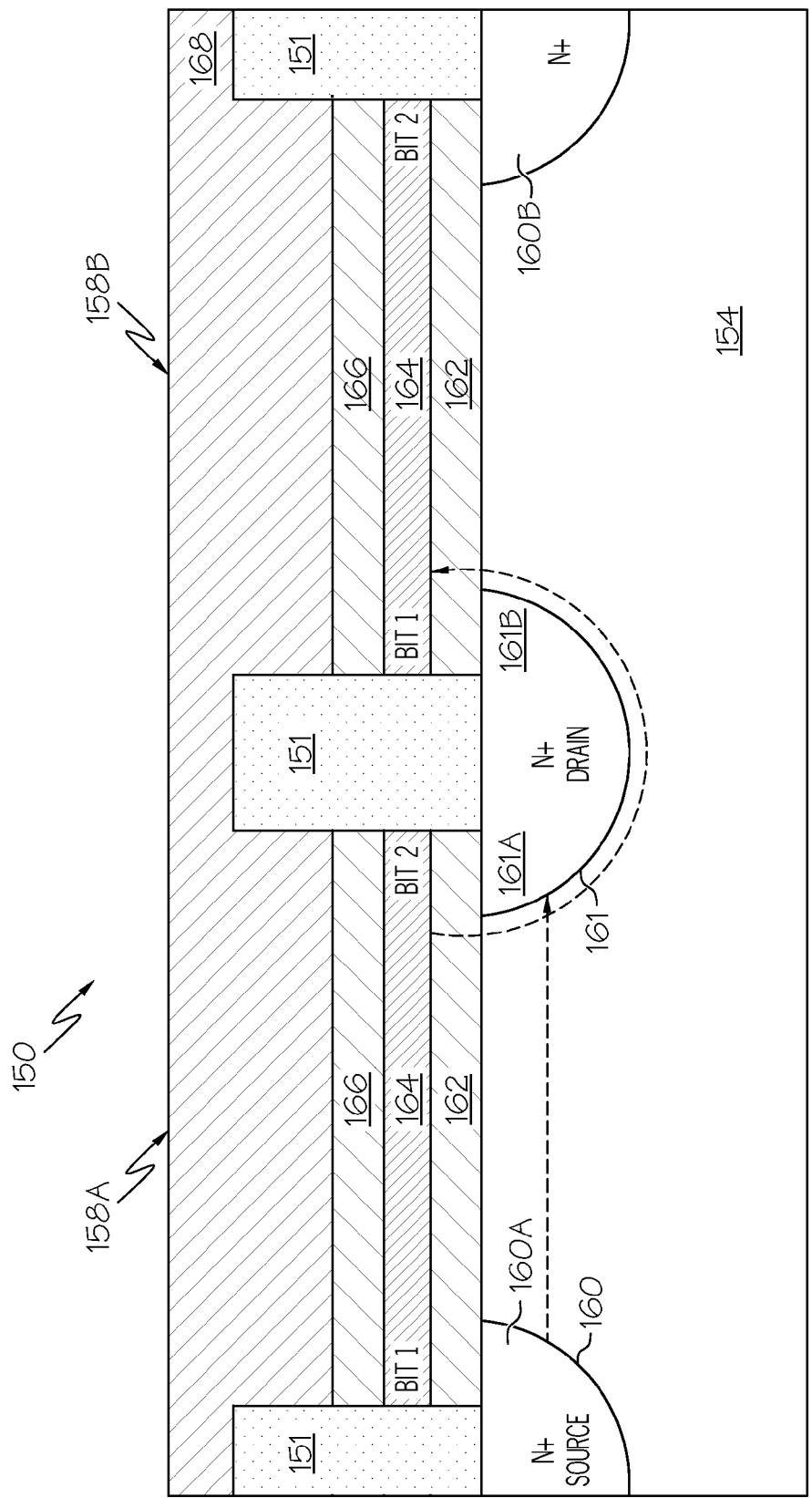
FIG. 1 illustrates a simplified cross-sectional view of a conventional dual-bit memory cell.

FIG. 1 is a cross-sectional view of a conventional dual-bit memory 150. Each memory cell 158 A, B of the dual-bit memory 150 has a dual-bit (BIT1, BIT2) architecture that allows twice as much storage capacity as a conventional EEPROM memory device.

The conventional dual-bit memory 150 includes a substrate 154, a first insulator layer 162 disposed over the substrate 154, a nitride charge storage layer 164 disposed over the first insulator layer 162, a second insulator layer 166 disposed over the charge storage layer 164, and a polysilicon control gate 168 disposed over the second insulator layer 166. To produce an operable memory device, a first metal silicide contact (not shown) can be disposed on substrate 154, and the control gate 166 can be capped with a second metal silicide contact (not shown).

In one implementation, the substrate 154 is a P-type semiconductor substrate 54 having first buried junction regions 160 and a second buried junction region 161 formed within substrate 154 in self-alignment with the memory cell 150. First buried junction regions 160 and second buried junction region 161 are each formed from an N+ semiconductor material. The first insulator layer 162, the charge storage layer 164, and the second insulator layer 166 can be implemented using an oxide-nitride-oxide (ONO) configuration in which a nitride charge storage layer 164 is sandwiched between two silicon dioxide insulator layers 162, 166. Alternatively, charge storage layer 164 may utilize buried polysilicon islands as a charge trapping layer. The charge storage layer 164 is capable of holding a charge.

Each memory cell 158 A, B can store two data bits: a left bit represented by the circle (BIT 1); and a right bit represented by the circle (BIT 2). In practice, each memory cell 158 A, B is generally symmetrical, thus first buried junction region 160 and second buried junction region 161 are interchangeable. In this regard, first buried junction region 160 may serve as the source region with respect to the right bit (BIT 2), while second buried junction region 161 may serve as the drain region with respect to the right bit (BIT 2). Conversely, second buried junction region 161 may serve as the source region with respect to the left bit (BIT 1), while first buried junction region 160 may serve as the drain region with respect to the left bit (BIT 1).

While two dual-bit memory cells 158 A, B are illustrated in FIG. 1, it will be appreciated that any suitable number of the dual-bit memory cells 158 could be used to form a memory array, as described below with reference to FIG. 2.

Figure 2:
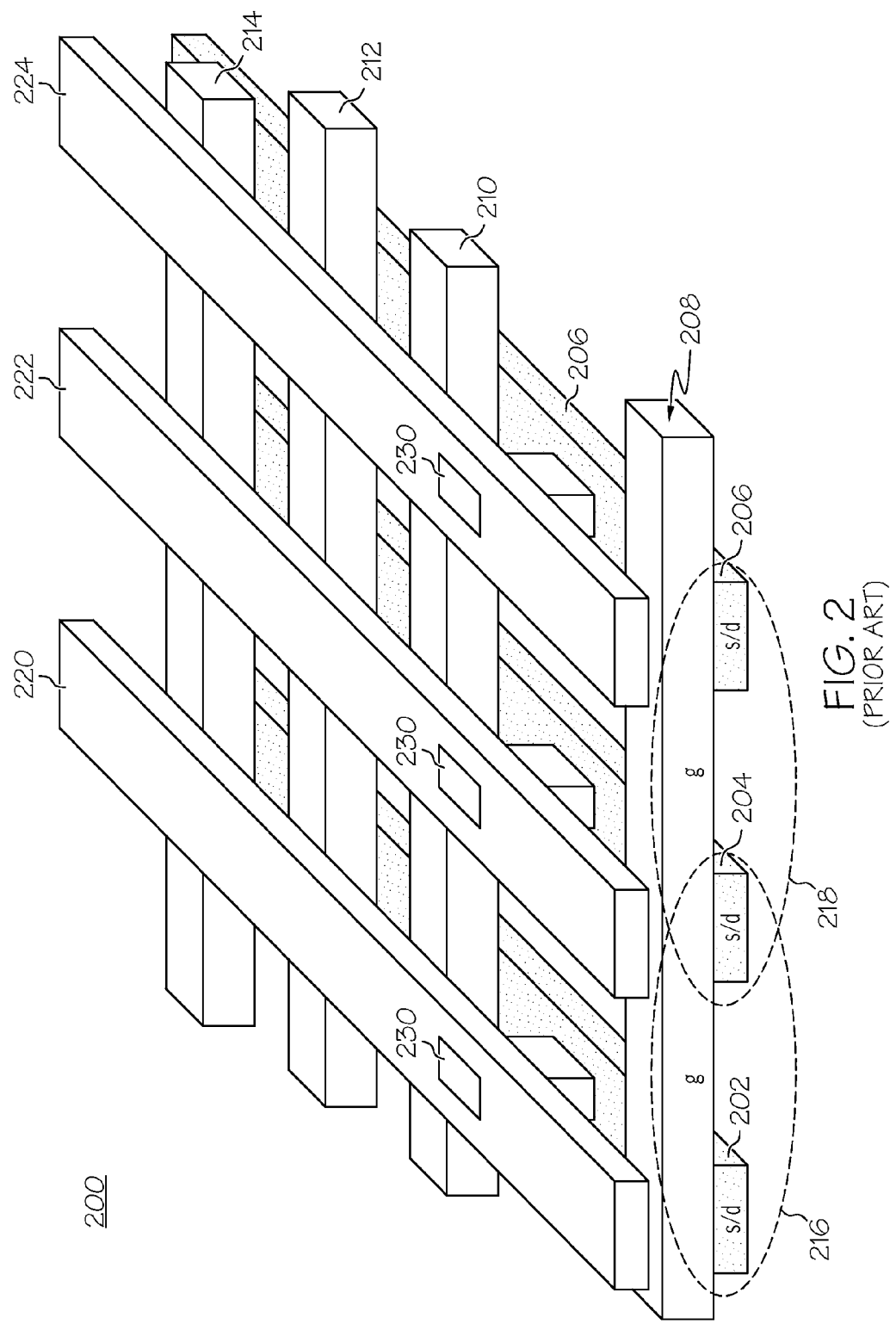
FIG. 2 illustrates a simplified diagram of a plurality of dual-bit memory cells arranged in accordance with a conventional array architecture.

FIG. 2 is a simplified diagram of a plurality of dual-bit memory cells arranged in accordance with a conventional array architecture 200 (a practical array architecture can include thousands of dual-bit memory cells). Array architecture 200 includes a number of buried bit lines formed in a semiconductor substrate as mentioned above. FIG. 2 depicts three buried bit lines (BLs) 202, 204, and 206, each being capable of functioning as a drain or a source for memory cells in array architecture 200. Array architecture 200 also includes a number of word lines (WLs) which correspond to the gate of the memory cells and are utilized to control the gate voltage of the memory cells. FIG. 2 depicts four WLs 208, 210, 212, and 214 that generally form a crisscross pattern with the bit lines. Although not shown in FIG. 2, charge storage layer, such as an ONO stack, resides between the BLs and the WLs. The dashed lines in FIG. 2 represent two of the dual-bit memory cells in array architecture 200: a first cell 216 and a second cell 218. Notably, BL 204 is shared by first cell 216 and second cell 218. Array architecture 200 is known as a virtual ground architecture because ground potential can be applied to any selected BL and there need not be any BLs with a fixed ground potential.

Control logic and circuitry (not shown) for array architecture 200 governs the selection of memory cells, the application of voltage to the WLs 208, 210, 212, 214, and the application of voltage to the BLs 202, 204, 206 during conventional flash memory operations, such as: programming; reading; erasing; and soft programming. Voltage is delivered to the BLs 202, 204, 206 using BL contacts 230. FIG. 2 depicts three conductive metal lines 220, 222, and 224 and three BL contacts 226, 228, and 230. Because the resistance of the BLs 202, 204, 206 is very high, for a given BL 202, 204, 206, a BL contact is used, for example, once every 8, 16, or 256 WLs.

Referring again to FIG. 1, a memory cell can be programmed using hot electron injection techniques (also known as channel hot electron (CHE) injection programming). In accordance with conventional programming techniques, the right bit (BIT 2) is programmed by: applying a relatively high programming voltage (e.g., between 7 and 10 volts) to gate 168 via the appropriately selected WL; grounding or floating the BL corresponding to first buried junction region 160 (which serves as the source in this case) at a neutral voltage (e.g., approximately zero volts); and applying a relatively high drain bias voltage to the BL corresponding to second buried junction region 161 (which serves as the drain in this case) (e.g., applying a voltage to the drain 161 between 3.5 volts and 5.5 volts).

Setting the drain 161 at a relatively higher voltage than the source 160 creates a lateral field which accelerates electrons from the source 160 to the drain 161. Setting the gate 168 at a relatively high voltage sets up a strong vertical electrical field. When the electrons gain enough energy near the drain region 161, the strong vertical field pulls the electrons across the tunnel oxide layer 162 into BIT 2 of the nitride charge storage layer 164. These electrons are then trapped in the charge storage layer 164. (e.g., charge gets trapped in the nitride (an insulator) and does not move). Absence of a localized charge near the drain 161 area (at BIT 2) can be interpreted as a logical one, and presence of a localized charge near the drain 161 area (at BIT 2) can be interpreted as a logical zero (or vice versa). It will be appreciated that while in the following example the buried junction regions 160, 161 can be referred to as a source 160 and a drain 161, if biased in the opposite manner by switching the bias voltages on the buried junction regions 160, 161, the buried junction regions 160, 161 can also function as a drain and a source, respectively. This allows charge to be stored (or not stored) at BIT 1 on the other side of the charge storage layer 164.

Referring again to FIG. 2, conventional CHE programming of a flash memory array arranged in a virtual ground architecture may result in undesired BL-to-BL leakage current (represented by the dashed line arrow) flowing to different portions 161A, 161B of a BL 161 shared by two adjacent memory cells 158A, B. This BL leakage current become increasingly worse as the cell size shrinks. BL leakage current can occur, for example, during programming of a memory cell. For instance, during programming of the memory cell 158A, to program BIT 2, the first buried bit line 160 (e.g., source) is grounded, the word line (gate) 168 is brought up to a higher potential, and the second buried bit line 161 (e.g., drain) is brought up to higher potential to make a current flow along the channel from first buried bit line 160 to the second buried bit line 161. As the current flows from first buried bit line 160 to the second buried bit line 161 (e.g., drain/source), the BIT1 in the adjacent memory cell 158B can be inadvertently programmed if electrons flow to the second portion 161B of the second buried bit line 161. In other words, some of the electrons flowing from bit line 160 can go around/underneath bit line 161 so that unwanted electrons will flow to the right bit (BIT 1) of bit line 161. Because the electrons flow to the wrong side of bit line 161, BIT 1 that is stored on the right of bit line 161B of the adjacent cell 158B will also be inadvertently "disturbed" or programmed. This phenomenon is sometimes referred to as a "transient programming disturbance (TPD)."

BL leakage current can also occur, for example, during conventional read and verification operations for virtual ground architecture (e.g., verification operations such as soft program verify, erase verify, and program verify) and adversely affect the read and verification results. Accordingly, it is desirable to control, reduce, or eliminate leakage current during programming of memory cells in a virtual ground architecture. In addition, it is desirable to control, reduce, or eliminate the leakage current component during read and verification operations of memory cells in a virtual ground architecture.

It would be desirable to provide improved techniques for reducing or preventing a transient programming disturbance (TPD) on an adjacent cell in a dual-bit memory cell by electrons traveling under bit lines shared by adjacent memory cells.

FIGS. 3-8 illustrate a simplified cross-sectional view of a multiple-bit per cell memory device 350 and method steps for its fabrication in accordance with various embodiments of the invention. Various steps in the manufacture of multiple-bit per cell memory devices are well known and so, in the interest of brevity, many conventional steps will only be mentioned briefly herein or will be omitted entirely without providing the well known process details.

Figure 3:
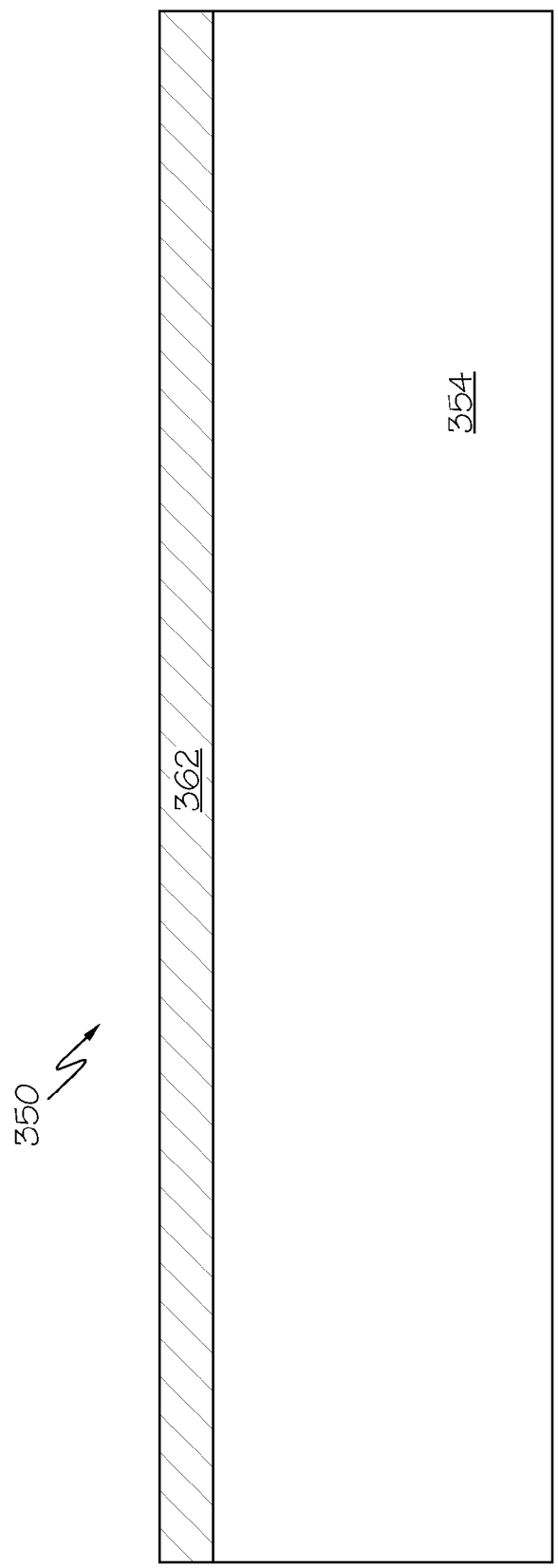
FIGS. 3-8 illustrate a simplified cross-sectional view of a multiple-bit per cell memory device and method steps for its fabrication in accordance with various embodiments of the invention.

As illustrated in FIG. 3, the manufacture of dual bit memory device 350 begins by providing a silicon substrate 354. As used herein, the term "silicon substrate" will be used to encompass the relatively pure silicon materials typically used in the semiconductor industry as well as silicon admixed with other elements such as germanium, carbon, and the like. The term "silicon substrate" also is used to encompass the substrate itself together with metal or insulator layers that may overly the substrate. Silicon substrate 354 may be a bulk silicon wafer or a thin layer of silicon on an insulating layer (commonly known as a silicon-on-insulator wafer or SOI wafer) that, in turn, is supported by a silicon carrier wafer.

An insulator layer 362 is deposited or thermally grown on the surface of the substrate 354. The insulator layer 362 is preferably a layer of silicon dioxide having a thickness of about 2-10 nanometers (nm), more preferably about 5 nm. Layer 362 can be a thermally grown layer of silicon dioxide or can be deposited, for example, by low pressure chemical vapor deposition (LPCVD) or plasma enhanced or plasma assisted CVD (PECVD). Thin insulator layer 362 is often referred to as a tunnel oxide layer, a layer through which programming or erasing charge carriers can tunnel.

Figure 4:
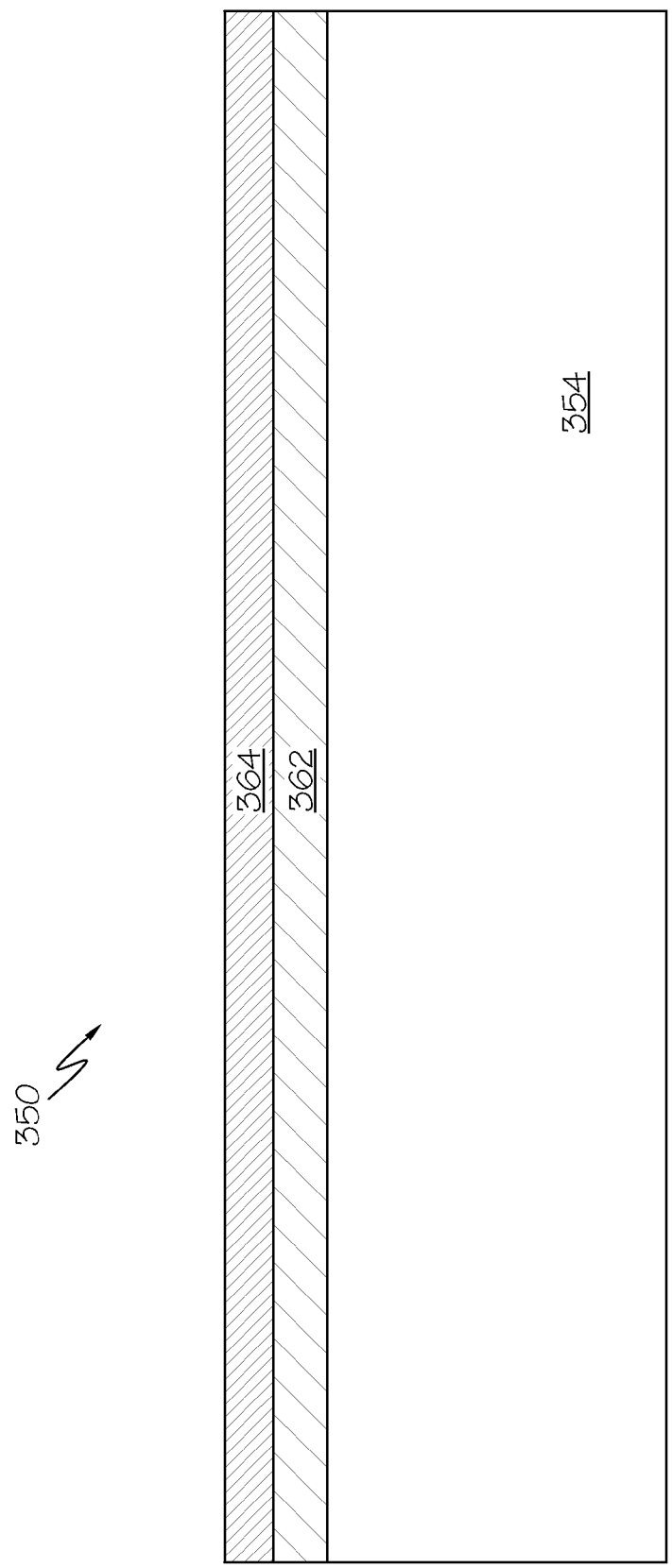

In FIG. 4, a charge trapping or storage layer 364 is deposited. Charge trapping layer 364 can be, for example, a layer of silicon nitride, silicon-rich silicon nitride, polycrystalline silicon, a combination of these, or any of the other well known charge trapping materials. Stoichiometric silicon nitride is $Si_xN_y$ for which x=3 and n=4; silicon-rich silicon nitride is a silicon/nitrogen material for which x/y is greater than ¾. Charge trapping layer 364 can be deposited, for example, to a thickness of about 3 to 20 nm by chemical vapor deposition (CVD), plasma enhanced chemical vapor deposition (PECVD), LPCVD, or by atomic layer deposition (ALD). When the charge storage layer 364 comprises silicon nitride, the silicon nitride can be deposited by the reaction of dichlorosilane and ammonia, although other silicon sources and other nitrogen sources can also be used.

Figure 5:
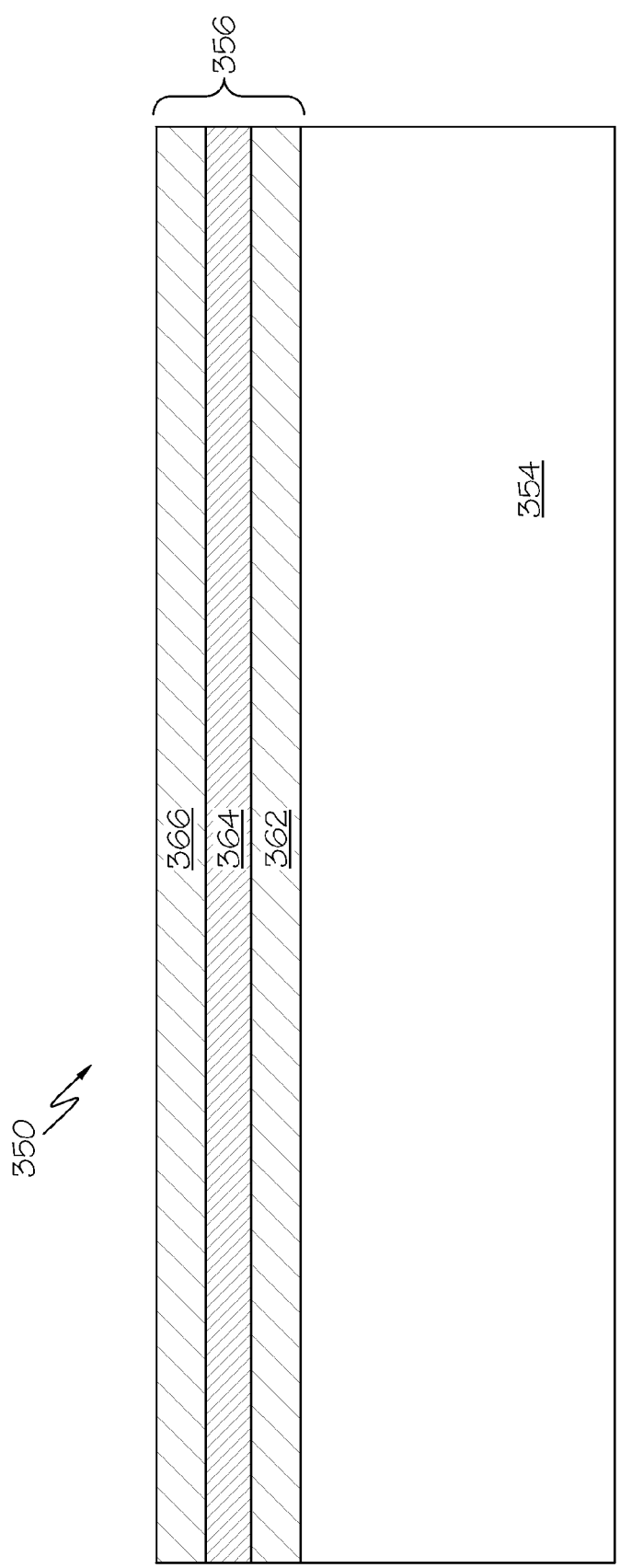

In FIG. 5, an insulator layer 366 is deposited or thermally grown on the charge storage layer 364. The insulator layer 366 preferably comprises an oxide layer, such as silicon dioxide, that is thermally grown on the surface of the substrate 354, or that is deposited, for example, from either a tetraethylorthosilicate (TEOS) or $SiH_4$ (silane) source. The oxide layer 362 can then be polished using, for example, using chemical mechanical polishing or chemical mechanical planarization (CMP).

Figure 6:
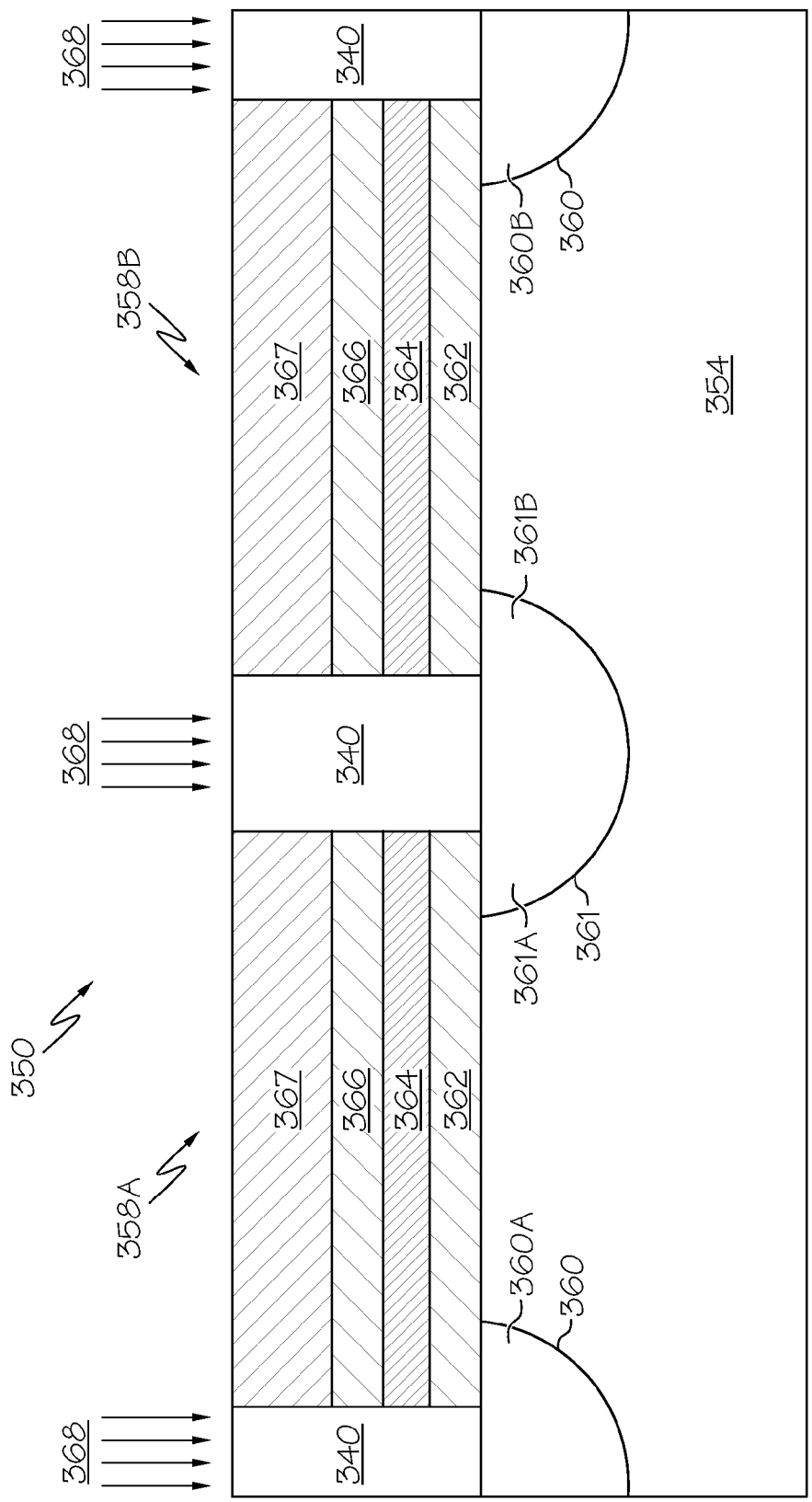

In FIG. 6, a hard mask layer 367 can then be formed overlying second insulating layer 366 and is selectively patterned using conventional photolithography methods to expose a surface of second insulating layer 366. Using hard mask layer 367 as an etch mask, second insulating layer 366, charge trapping layer 364, and first insulating layer 362 are etched by anisotropic etch processes, as illustrated in FIG. 6, to produce openings 340 through the ONO stack. For example, oxides and nitrides, are often etched in gas mixtures that include fluorocarbons ($C_xH_yF_z$) or chlorofluorocarbons ($C_wH_xCl_yF_z$). Oxide etchants, for example, can include $CHF_3$, $CF_4$, or $SF_6$. Silicon nitride can be etched in a $CHF_3/O_2$ mixture.

The hard mask layer 367 then is used as an ion implantation mask and conductivity-determining ions, indicated by arrows 368, are implanted into silicon substrate 354 to form a plurality of spaced-apart regions 360, 361. In one preferred embodiment of a P-channel device, semiconductor substrate 354 is impurity doped with P-type and N-type ions such as arsenic ions or phosphorus ions are implanted to form N-type bit lines. Once the ions are implanted, the ions can subsequently be diffused by thermal diffusion. In other words, the dopant material within the spaced-apart regions 360, 361 can be diffused into the substrate 354 by heating the substrate 354.

Figure 7:
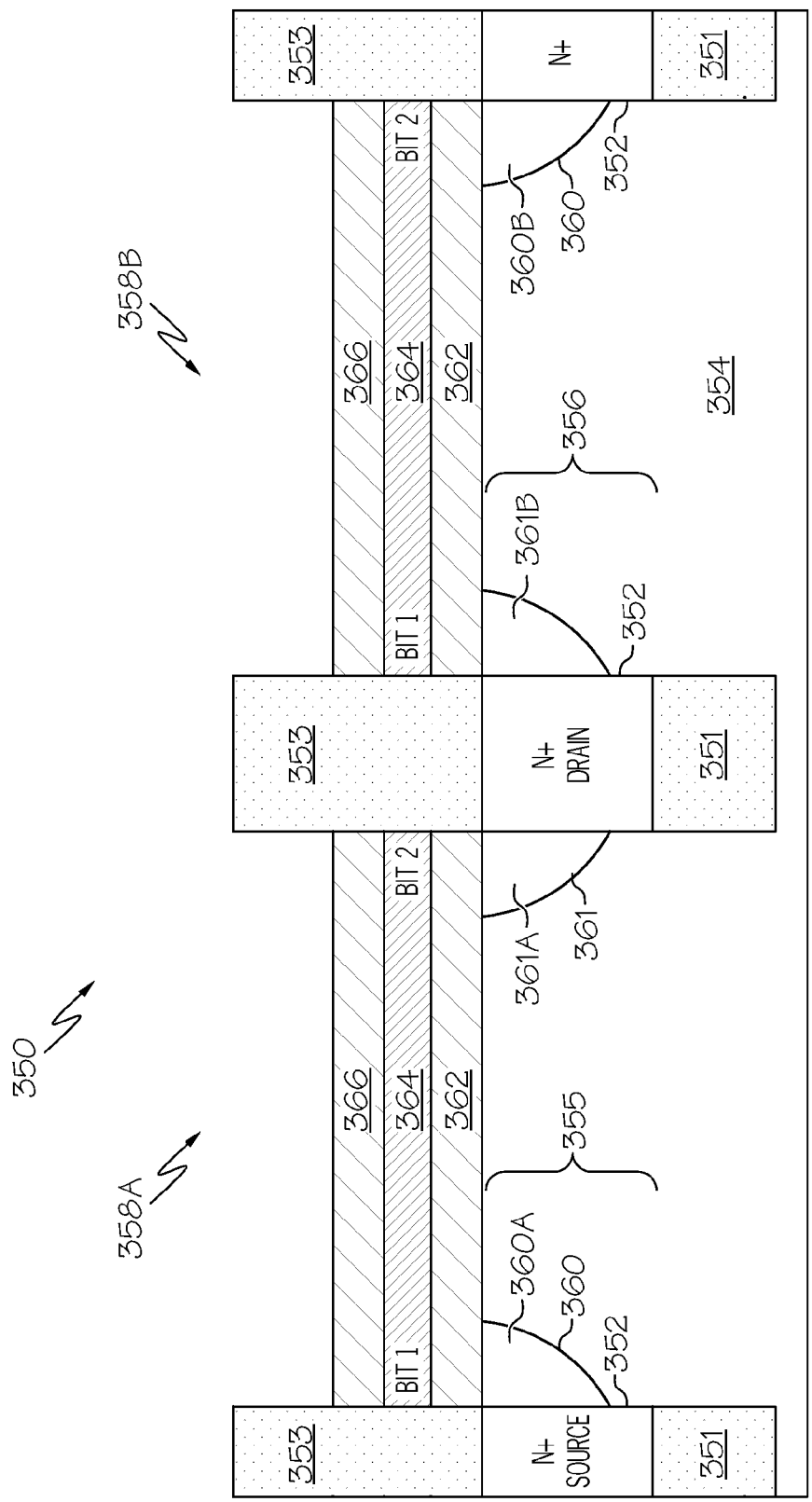

In FIG. 7, once the bit line regions 360, 361 are formed, a trench (not shown) is etched in the substrate 354 through the bit line regions 360, 361 using, for example, reactive ion etching (RIE). The trench is etched to a depth of approximately 100 nm below the surface of the substrate 354 so that the trench extends below the bit line regions 360, 361. In one embodiment, the substrate 354 can be etched in a Cl or HBr/$O_2$ chemistry.

Next, a layer of insulating material 351 can be deposited overlying the hard mask layer 367 and filling the trenches 340. For example, in one embodiment, an oxide layer 351 of a silicon oxide, such as silicon dioxide ($SiO_2$), can be deposited in the trench and overlying the surface of the hard mask layer 367. The layer of insulating material 351 can be formed using any known techniques. These techniques are known in art and will not be described further for sake of clarity.

Following the deposition, the top surface of insulating material 351 can be planarized by chemical mechanical planarization (CMP) to expose the hard mask layer 367 and to form insulating plugs (not shown) which overlie and extend through the bit line regions 360, 361. In some embodiments, the CMP process step is followed by an etch step to remove the hard mask layer 367 and to expose the top surfaces of layer 366.

After deposition, the deposited oxide layer 351 is formed on the sidewalls and the bottom of the trench. Anisotropic etching is then performed to remove the oxide layer 351 from the sidewalls, but leave a portion of the oxide layer 351 in the bottom of the trench as shown in FIG. 7. In some embodiments, the hard mask layer 367 can also be removed, but does not necessarily need to be removed. For example, in one embodiment, reactive ion etching (RIE) can be used as the anisotropic etching process. The oxide layer 351 can be etched, for example, in gas mixtures that include fluorocarbons ($C_xH_yF_z$) or chlorofluorocarbons ($C_wH_xCl_yF_z$), and etchants can include, for example, $CHF_3$, $CF_4$, or $SF_6$.

After the excess portions of the oxide layer 351 have been removed from the trenches, a conductive layer 352 can be deposited or epitaxially grown in the trench up to the surface of the substrate 354. For example, in one embodiment, polysilicon can be epitaxially grown in the trench up to the surface of the substrate 354. As appreciated by those skilled in the art, selective epitaxial layers can be grows only on areas of exposed silicon in the trenches, and nothing is deposited on the masking layer 367 around the exposed area. In some embodiments, the polysilicon can be doped in situ during growth with an appropriate conductivity determining dopant, such as arsenic or phosphorous.

Once the conductive layer 352 is formed, another layer of insulating material 353, such as a layer of a silicon oxide, can be deposited which fills the remainder of the trenches and overlies the hard mask layer 367 (if the hard mask has not already been removed when the oxide layer 351 is etched). Following the deposition, the top surface of insulating material 353 can be planarized by chemical mechanical planarization (CMP) to expose the hard mask layer 367 and to form isolation regions 353 which overlie the bit line regions 360, 361 between adjacent memory cells 358A, 358B. The CMP process step is followed by an etch step to remove the hard mask layer 367 and to expose the top surfaces of insulator layer 366.

Figure 8:
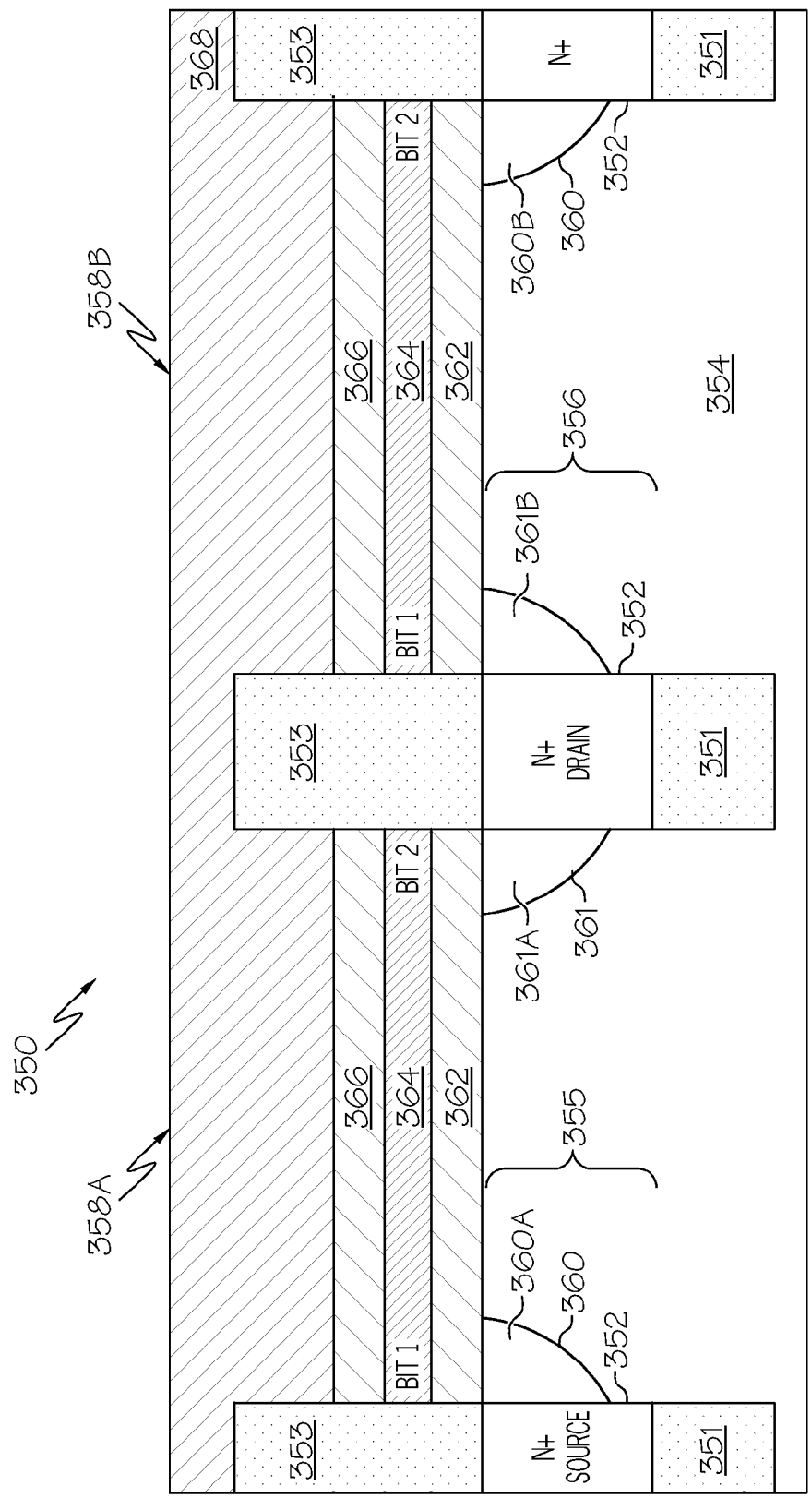

As shown in FIG. 8, the structure 350 can be completed by depositing a blanket layer of conductive material 368, such as polycrystalline silicon, overlying the exposed surfaces of insulator layer 366 and the isolation regions 353.

FIG. 8 illustrates a simplified cross-sectional view of the multiple-bit per cell memory device 350 in accordance with one embodiment of the invention. The multiple-bit per cell memory device 350 comprises a plurality of multiple-bit per cell memory cells including a first memory cell 358A and a second memory cell 358B. In this illustrative embodiment the multiple-bit per cell memory device 350 is illustrated as two P-channel devices. It will be appreciated that the inventive concepts can also be applied in the context of N-channel fabrication technologies with appropriate change for device type. The described techniques may be appropriately integrated to fabricate complimentary channel devices. Many different integrated circuits (ICs) can be formed with multiple-bit per cell memory device 350. Such ICs can include a large number of such multiple-bit per cell memory devices 350, and may also include N-channel devices as well. Multiple-bit per cell memory devices 350 can be applied in numerous applications, some of which may include, for example, wireless communication devices, such as mobile telephones, smartphones, personal digital assistants (PDAs), set-top boxes, digital video recorders (DVRs), DVD players and recorders, networking and telecommunications equipment, printers, peripheral computing devices, automotive systems, gaming systems, industrial applications, embedded systems, etc.

In the multiple-bit per cell memory device 350, each memory cell 358 A, B comprises a semiconductor structure 354 which includes a pair of buried bit lines, 355, 356, an ONO stack 362, 364, 366, and a word line 368 which overlies each of the first memory cell 358A and the second memory cell 358B.

The isolation regions 353 isolate adjacent memory cells from each other by preventing charges from moving across a bit line from one cell to an adjacent cell. For example, isolation region 353 is formed overlying the substrate 354 between the first memory cell 358A and the second memory cell 358B to isolate the first memory cell 358A and the second memory cell 358B. The isolation regions 353 also isolate bit lines 355, 356 from word lines 368 when different bias voltages are applied to certain bit lines 355, 356 and word lines 368 during operation of a memory cell (e.g., when a memory cell is being programmed, erased or read).

The ONO stack 362, 364, 366 is provided over the silicon substrate 354. For example, a charge storage layer 364 is provided over an oxide layer 362 which overlies the silicon substrate 354, and another oxide layer 366 is provided which overlies the charge storage layer 364. When each memory cell is complete, the charge storage layer 364 in each memory cell 358A, 358B includes a first charge storage region capable of storing BIT1 and a second charge storage region capable of storing BIT2. The layers comprising ONO stack can be any suitable multi-layer dielectric-charge trapping-dielectric stack comprising first insulating layer 362, silicon nitride layer 364 overlying first insulating layer 362, and a second insulating layer 366 overlying silicon nitride layer 364. In an exemplary embodiment of the invention, ONO stack has a total thickness that is no greater than about 25 nm.

Each of the buried bit lines 355, 356 is shared by two adjacent memory cells. For example, buried bit line 361 is shared by the first memory cell 358A and the second memory cell 358B. In other words, the portion 360A of buried bit line 355 and the portion 361A of buried bit line 356 are part of the first memory cell 358A, whereas the portion 360B of buried bit line 355 and the portion 361B of buried bit line 356 are part of the second memory cell 358A. In this exemplary implementation, three buried bits lines 360, 361 are shown for purposes of clarity. However, it will be appreciated that in practical implementations, many thousands of memory cells are provided in a device, and the memory cells (and their corresponding bit lines) have a similar construction.

Each of the buried bit lines comprise a conductive region 352 and optionally diffused portions which are also part of the buried bit line 356. In one embodiment, the conductive region 352 comprises in situ doped polysilicon doped with a conductivity determining dopant. For example, as shown in FIG. 8, the buried bit line 356 comprises a conductive region 352, a first diffused portion 361A and a second diffused portion 361B. In this exemplary embodiment, the conductive region 352 and the diffused regions 360, 361 comprise N+ conductive material or materials, such as, N+ polycrystalline silicon material. However, it will be appreciated that in a corresponding N-channel implementation, the diffused regions (not shown) would comprise a P+ polysilicon material embedded in an N+ doped silicon substrate 354.

The first diffused portion 361A and the second diffused portion 361B are diffused such that they extend (in the lateral direction of FIG. 8) far enough to define a region which can allow for programming between BIT1 and BIT2. The first diffused portion 361A is spaced apart from and the second diffused portion 361B by an amount equal to the width of the conductive region 352. In one embodiment, the first diffused portion 361A is spaced apart from and the second diffused portion 361B by a distance (i.e., the horizontal dimension in FIG. 8) that is between 20 and 80 nanometers. In one embodiment, the conductive region 352 has a height (i.e., the vertical dimension in FIG. 8) that extends into the substrate 354 between 10 nanometers and 50 nanometers from an upper surface of the substrate 354. It will be appreciated that these dimensions are merely exemplary in nature, and that these exemplary dimensions can vary within or outside (e.g., above or below) the ranges specified above.

Moreover, in this exemplary embodiment, in order to illustrate programming of the memory cell 358B, it is assumed that the buried bit lines 355 are grounded and hence serve as source regions, whereas the buried bit line 356 is biased at a positive voltage and therefore is designated as part of a drain region. Although the buried bit lines 355 are designated as part of source regions, and the buried bit line 356 is designated as part of a drain region, it will be appreciated by those skilled in the art that the source and drain designations are arbitrary and interchangeable. For instance, the buried bit lines 355, 356 can also serve as part of drain and source regions, respectively, depending on the relative bias voltages applied to those buried bit lines 355, 356.

Insulator regions 351 are disposed in the substrate 354 below each of the buried bit lines 355, 356. The insulator regions 351 are designed to have a depth adequate to prevent electrons from flowing between adjacent memory cells. The insulator regions 351 are provided to control, prevent or drastically reduce the likelihood of a leakage current by providing an obstacle in the substrate 354 which makes it more difficult for a leakage current to flow from the bit line 355 of memory cell 358A to the second portion 361B of bit line 356 of memory cell 358B. For a leakage current to flow between the adjacent cells (e.g., from the bit line 355 of memory cell 358A to the second portion 361B of bit line 356 of memory cell 358B), the magnitude of a leakage current would have to be strong enough to flow underneath the insulator regions 351. By making the insulator regions 351 sufficiently deep, the insulator regions 351 are can effectively block the current path between the first portion 361A and the second portion 361B. As such, the configuration shown in FIG. 8 is less susceptible to and can prevent a leakage current flowing from the bit line 355 to the second portion 361B of bit line 356.

In one embodiment, the insulator region 351 has a height (i.e., the vertical dimension in FIG. 8) that is between 20 nanometers and 200 nanometers. It will be appreciated that these dimensions are merely exemplary in nature, and that these exemplary dimensions can vary within or outside (e.g., above or below) the ranges specified above.

The insulator region 351 serves as an isolation trench below the conductive region 352 of buried bit line 356 such that electrons diffusing from the source 355 in a lateral direction encounter an energy barrier at an interface between the substrate 354 and the insulator region 351 which prevents the electrons from being injected into the second portion 361B. The isolation trench 351 can be filled with any conventional insulator material with properties that can prevent electrons from flowing between the first portion 361A and the second portion 361B.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of cells described in an exemplary embodiment without departing from the scope of the invention as set forth in the appended claims and their legal equivalents.

What is claimed is:

1. A semiconductor memory device, comprising:
    a first dual-bit memory cell comprising a first shared bit line in a substrate and a second shared bit line in the substrate;
    a second dual-bit memory cell adjacent to the first dual-bit memory cell, the second dual-bit memory cell comprising the second shared bit line, wherein the second shared bit line is disposed between the first and second dual-bit memory cells, wherein the second shared bit line comprises:
        an epitaxial polysilicon region disposed in the substrate, a first implanted portion underlying a first memory cell ONO stack, and a second implanted portion underlying a second memory cell ONO stack and being spaced apart from the first implanted portion by the epitaxial polysilicon region, wherein the epitaxial polysilicon region has a depth into the substrate greater than the depth of the first and second implanted portions; and
        an insulator region disposed only within the substrate directly beneath and in contact with the epitaxial polysilicon region, and extending into the substrate to a depth sufficient to prevent electrons from flowing between the first dual-bit memory cell and the second dual-bit memory cell, wherein the whole insulator region is entirely beneath a greatest depth into the substrate of the epitaxial polysilicon region.

2. A semiconductor memory device according to claim 1, wherein the insulator region comprises:
    an isolation trench disposed in the substrate below the second shared bit line, wherein the isolation trench is filled with an insulator material to prevent electrons from flowing between the first shared bit line of the first dual-bit memory cell and the second implanted portion of the second shared bit line of the second dual-bit memory cell.

3. A semiconductor memory device according to claim 2, wherein the isolation trench has a depth adequate to prevent electrons from flowing between the first shared bit line of the first dual-bit memory cell and the second implanted portion of the second shared bit line of the second dual-bit memory cell.

4. A semiconductor memory device according to claim 1, further comprising:
    an interface between the substrate and the insulator region, wherein electrons diffusing from the first dual-bit memory cell during programming of the first dual-bit memory cell encounter an energy barrier at the interface which prevents the electrons from being injected into the second dual-bit memory cell.

5. A semiconductor memory device according to claim 1, wherein the first implanted portion is spaced apart from the second implanted portion by a distance between 20 nanometers and 80 nanometers.

6. A semiconductor memory device according to claim 5, wherein the epitaxial polysilicon region extends into the substrate between 10 nanometers and 50 nanometers.

7. A semiconductor memory device according to claim 6, wherein the insulator region comprises an oxide.

8. A semiconductor memory device according to claim 7, wherein the oxide comprises silicon dioxide ($SiO_2$).

9. A semiconductor memory device according to claim 1, wherein the epitaxial polysilicon region comprises in situ doped polysilicon.

10. A semiconductor memory device according to claim 1, further comprising:
    a word line overlying the first dual-bit memory cell and the second dual-bit memory cell.

11. A semiconductor memory device according to claim 1, wherein the epitaxial polysilicon region comprises doped polysilicon.

12. A semiconductor memory device according to claim 1, wherein the first dual-bit memory cell and the second dual-bit memory cell further comprise:
    a first oxide layer overlying the substrate;
    a charge storage layer comprising a first charge storage region and a second charge storage region; and
    a second oxide layer overlying the charge storage layer.

13. A semiconductor memory device according to claim 1, wherein the semiconductor memory device comprises a multiple-bit per cell memory array comprising a plurality of dual-bit memory cells.

14. A semiconductor memory device according to claim 1, wherein the first shared bit line is shared by the first dual-bit memory cell and another dual-bit memory cell.

15. The semiconductor memory device of claim 1, wherein the insulator region has a thickness of between approximately 20 nm and less than 50 nm.

16. A semiconductor memory device, comprising:
    a first dual-bit memory cell comprising a first shared bit line in a substrate and a second shared bit line in the substrate;
    a second dual-bit memory cell adjacent to the first dual-bit memory cell, the second dual-bit memory cell comprising the second shared bit line, wherein the second shared bit line is disposed between the first and second dual-bit memory cells, wherein the second shared bit line comprises:
        an epitaxial polysilicon region disposed in the substrate, a first implanted portion underlying a first memory cell ONO stack, and a second implanted portion underlying a second memory cell ONO stack and being spaced apart from the first implanted portion by the epitaxial polysilicon region, wherein the first and second implanted portions are implanted before the epitaxial polysilicon region, wherein the epitaxial polysilicon region has a depth into the substrate greater than the depth of the first and second implanted portions; and
        an insulator region disposed only within the substrate directly beneath and in contact with the epitaxial polysilicon region, and extending into the substrate to a depth sufficient to prevent electrons from flowing between the first dual-bit memory cell and the second dual-bit memory cell, wherein the whole insulator region is entirely beneath a greatest depth into the substrate of the epitaxial polysilicon region.

17. A semiconductor memory device according to claim 16, wherein the first shared bit line is shared by the first dual-bit memory cell and another dual-bit memory cell.

18. A semiconductor memory device according to claim 16, wherein the insulator region comprises:
   an isolation trench disposed in the substrate below the epitaxial polysilicon region, the first implanted portion and the second implanted portion, wherein the isolation trench is filled with an insulator material to prevent elections from flowing between the first shared bit line of the first dual-bit memory cell and the second implanted portion of the second shared bit line of the second dual-bit memory cell.

19. The semiconductor memory device of claim 16, wherein the insulator region has a thickness of between approximately 20 nm and less than 50 nm.

20. An electronic device, comprising:
   a semiconductor device comprising:
      a first dual-bit memory cell comprising a first shared bit line in a substrate and a second shared bit line in the substrate;
      a second dual-bit memory cell adjacent to the first dual-bit memory cell, the second dual-bit memory cell comprising the second shared bit line, wherein the second shared bit line is disposed between the first and second dual-bit memory cells, wherein the second shared bit line comprises:
         an epitaxial polysilicon region disposed in the substrate, a first implanted portion underlying a first memory cell ONO stack, and a second implanted portion underlying a second memory cell ONO stack and being spaced apart from the first implanted portion by the epitaxial polysilicon region, wherein the epitaxial polysilicon region has a depth into the substrate greater than the depth of the first and second implanted portions; and
      an insulator region disposed only within the substrate directly beneath and in contact with the epitaxial polysilicon region, and extending into the substrate to a depth sufficient to prevent electrons from flowing between the first dual-bit memory cell and the second dual-bit memory cell, wherein the whole insulator region is entirely beneath a greatest depth into the substrate of the epitaxial polysilicon region.

21. An electronic device according to claim 20, wherein the first shared bit line is shared by the first dual-bit memory cell and another dual-bit memory cell.

22. The electronic device of claim 20, wherein the insulator region has a thickness of between approximately 20 nm and less than 50 nm.

* * * * *